United States Patent [19]

Jäger et al.

[11] 4,115,164
[45] Sep. 19, 1978

[54] METHOD OF EPITAXIAL DEPOSITION OF AN $A_{III}B_V$-SEMICONDUCTOR LAYER ON A GERMANIUM SUBSTRATE

[75] Inventors: Hans Jäger, Bad Homburg; Emil Seipp, Eschborn, both of Germany

[73] Assignee: Metallurgie Hoboken-Overpelt, Belgium

[21] Appl. No.: 757,935

[22] Filed: Jan. 10, 1977

[30] Foreign Application Priority Data

Jan. 17, 1976 [DE] Fed. Rep. of Germany ....... 2601652

[51] Int. Cl.$^2$ .................. H01L 21/20; H01L 29/26
[52] U.S. Cl. .................................... 148/175; 29/578; 148/187; 148/188; 156/612; 357/16; 357/17; 427/94
[58] Field of Search ............. 148/175, 187, 188; 29/578; 156/612; 427/93, 94; 357/16, 17

[56] References Cited

U.S. PATENT DOCUMENTS

| | | | |
|---|---|---|---|
| 3,663,319 | 5/1972 | Rose | 148/175 |
| 3,723,201 | 3/1973 | Keil | 148/175 |
| 3,745,423 | 7/1973 | Kasano | 148/175 X |
| 3,769,104 | 10/1973 | Ono et al. | 148/175 |
| 3,801,384 | 4/1974 | Schmidt | 148/188 |
| 3,839,082 | 10/1974 | Kasano et al. | 148/175 X |
| 3,856,588 | 12/1974 | Hashimoto et al. | 148/188 |
| 3,861,969 | 1/1975 | Ono et al. | 148/187 |
| 4,000,020 | 12/1976 | Gartman | 148/175 |

OTHER PUBLICATIONS

Burmeister et al., "Epitaxial Growth of GaAr$_{1-x}$P$_x$ on Germanium Substrates" Trans. of Metallurgical Soc. of Aime, vol. 245, Mar. 1969, pp. 565–569.
Ladd et al., "Autodoping . . . GaAr-Ge Heterojunctions" Metallurgical Transactions, vol. 1, Mar. 1970, pp. 609–616.

Primary Examiner—R. Dean
Assistant Examiner—W. G. Saba
Attorney, Agent, or Firm—McGlew and Tuttle

[57] ABSTRACT

The method makes possible the manufacture of luminescence diodes on the basis of GaAsP or other ternary semiconductor layers deposited on a Ge substrate of n-type conductivity, followed by a zinc diffusion. In the method, a resist layer is deposited on the backside of the Ge substrate to passivate the backside to an extent such that it becomes thermally and chemically stable and does not release any Ge to the ambient atmosphere, and the front side of the Ge substrate is chemo-mechanically polished to microsmoothness. Immediately before the epitaxial deposition, the polished front side is subjected to a very weak chemical etching to a removal depth of 500 A units without eliminating the polish or microsmoothness and, thereupon, the substrate is heated, in a high purity hydrogen atmosphere, to a temperature between about 680° C and 720° C and a GaAs layer is deposited on the front side. The temperature is then increased and there is deposited, on the GaAs layer, a ternary $A_{III}B_V$ compound including a third, additive component whose proportion increases in the direction away from the GaAs layer and which consists of either an $A_{III}$ element or a $B_V$ element. The increase in concentration of the third component is continued to a predetermined final value determined by either the band gap or the corresponding wavelength of the emitted light, and then a third relatively thick layer of the ternary component is deposited, and the composition thereof is maintained constant at the predetermined final value of the second layer.

18 Claims, No Drawings

METHOD OF EPITAXIAL DEPOSITION OF AN $A_{III}B_V$-SEMICONDUCTOR LAYER ON A GERMANIUM SUBSTRATE

FIELD AND BACKGROUND OF THE INVENTION

The present invention relates to a method of epitaxial deposition of an $A_{III}B_V$- semiconductor layer on a germanium substrate having a (100) orientation. The method makes possible the manufacture of luminescence diodes on the basis of GaAsP or other ternary semiconductor layers deposited on a Ge substrate of n-type conductivity, followed by a zinc diffusion. For manufacturing devices for optic communications, GaAs epitactic layers are also used.

DESCRIPTION OF THE PRIOR ART

Repeated attempts have already been made to deposit the $A_{III}B_V$- semiconductor GaAs$_{1-x}$P$_x$, which alone is commercially employed in larger amounts, on the relatively inexpensive and easily obtainable substrate Ge. Up to the present time, however, all attempts so far published to make really light-emitting diodes of GaAsP on a Ge substrate, in a technically reproducible manner, have failed. The problem in this connection is that, on the one hand, when depositing $A_{III}B_V$ layers, the amount of built-in Ge atoms must remain markedly below $1 \cdot 10^{17} cm^{-3}$, if possible, below $10^{16} cm^{-3}$, and, on the other hand, during the later zinc diffusion process, the Ge tending to alloy with zinc and with arsenic must be protected suitably from forming such alloys.

SUMMARY OF THE INVENTION

The present invention is directed to the problem of overcoming the mentioned difficulties and to the development of a method making it possible to deposit an $A_{III}B_V$- semiconductor layer on a Ge substrate, namely, of n-type conductivity, as used for manufacturing luminescence diodes, while preventing atoms from penetrating in disturbing amounts from the Ge substrate into the deposited semiconductor layer.

It has been found that this problem can be solved in a technologically progressive manner by depositing a resist layer on the backside of the Ge substrate to passivate the backside to an extent such that it becomes thermally and chemically stable and does not release any Ge to the ambient atmosphere, and chemo-mechanically polishing the front side of the Ge substrate to microsmoothness. Following this, and immediately before the epitaxial deposition, the polished front side of the Ge substrate is subjected to a very weak chemical etching to a removal depth of 500 A units without eliminating the polish or microsmoothness of the front side, after which the substrate is heated, in a high purity hydrogen atmosphere, to a temperature between about 680° C and 720° C, and a GaAs layer is deposited on the front side. The temperature is then increased while there is deposited, on the GaAs layer, a ternary $A_{III}B_V$ compound, including a third, additive component whose proportion increases in the direction away from the GaAs layer, and which consists of either an $A_{III}$ or a $B_V$ element. The increase in concentration of the third additive compound is continued to a predetermined final value determined by the band gap or by the corresponding wavelength of the emitted light, whereupon, as a final step, a third, relatively thick, layer is deposited, the composition of which is kept constant at the preset final value of the second layer.

With the epitaxial layers deposited in accordance with the inventive method, red, yellow, orange, or green light-emitting luminescence diodes, for example, can be manufactured, in which case the use of Ge wafers instead of the hitherto usual GaAs substrates leads to considerable cost savings and entails the possibility of utilizing large, defect-free, monocrystalline wafers. Advantages of the inventive method appear also when such GaAs epitaxial layers are used as a basis of devices for optic communications.

In addition, the inventive method makes it possible to produce GaAs and GaAsP, and further ternary $A_{III}B_V$ compounds on the basis of GaAs, also for other applications, for example, GaAs for so-called Gunn-devices, for microwave diodes such as avalanche diodes, Schottky-barrier diodes, laser devices, solar cells, etc.

In an advantageous variant of the inventive method, the cover or resist layer deposited on the back side is a phosphosilica glass layer (PSG layer) having an expansion coefficient conforming to the Ge substrate and a thickness of 0.15 to 0.3 microns. Otherwise, the back side resist layer may also be a $Si_3N_4$ layer deposited in a pyrolytic way, for example, by chemical vapor deposition (CVD process), or by sputtering, in a thickness of 0.15 to 0.3 microns.

The chemical etching of the polished front side of the Ge substrate may be effected very satisfactorily with a 10% NaCN solution, for a period of time of approximately 2 minutes.

In accordance with another variant of the invention, for depositing the GaAs layer which is to form the first layer on the front side of the substrate, gaseous arsine (As $H_3$), diluted in high-purity hydrogen, and HCl gas, diluted in $H_2$, are used as the starting substances, and the HCl gas is directed over gallium, which is heated to 700°–900° C, whereby, volatile Ga chlorides are formed. The flow density of the carrier gas ($H_2$) is kept at a value below approximately 1.00 $1/h.cm^2$ and the flow density of the reactive gases altogether is kept lower than about 0.03 $1/h.cm^2$. After a first Ga layer in a thickness of several microns has been deposited, it is useful to increase, for example, double or triple, the rate of the reactive gases, in order to rapidly deposit a larger amount of GaAs.

In a further, preferred, variant of the inventive method, which is related specifically to the production of layers for red light-emitting luminescence diodes, the ternary $A_{III}B_V$ compound employed is GaAsP, which is deposited on the GaAs layer at a temperature of about 790° C and in a manner such that, first, a transition layer with a GaP content increasing from 0 to approximately 38 mole% is deposited up to a thickness of about 20 to 39 microns and, thereon, in approximately the same thickness, the GaAsP layer of constant composition (38±2 mole% of GaP) is deposited. The above cited value of 38 mole% is valid for red light emission. For orange, yellow, or green light-emitting diodes, an addition of more GaP is necessary.

For manufacturing luminescence diodes, still another variant of the invention provides that, to produce a p-n-junction, zinc is diffused into the GaAsP layer of constant composition, either from a solid state diffusion source or in a zinc-phosphorus vapor while avoiding arsine vapor. In some instances, it is advantageous to deposit a diffusion barrier layer of $SiO_2$ below the layer containing zinc, and, on top of this layer, to deposit a phosphosilica glass layer as a resist layer, in order to prevent zinc losses.

Advantageously, the mentioned diffusion barrier layer, the diffusion source layer containing zinc, and the PSG layer are constituted of correspondingly doped silica emulsions which are consecutively deposited on the epitaxial wafer by spinning. The coating technique is identical with that used for depositing photoresists in semiconductor technology.

An object of the invention is to provide an improved method of epitaxial deposition of an $A_{III}B_V$ semiconductor layer on a germanium substrate.

Another object of the invention is to provide such a method which obviates the disadvantages of prior art methods.

A further object of the invention is to provide such a method which is more efficient and less expensive than known prior art methods.

DESCRIPTION OF THE PREFERRED EMBODIMENTS

Further features, advantages and possibilities of application of the inventive method may be learned from the following explanation of preferred embodiments.

EXAMPLES

The substrate used in these examples was Ge of n-type conductivity which, in most of the cases, was doped with arsenic. The resistivity of Ge was between 0.01 and 0.1 Ohm.cm. The Ge was of (100) orientation with small angular deviations in the order of up to about 3°.

To passivate the backside, a resist layer was deposited formed by either a PSG layer (phosphosilicate glass) with an expansion coefficient conforming to Ge and having a thickness of 0.15 to 0.3 microns, or a $S_3N_4$ layer of approximately the same thickness, deposited in a pyrolytic way (CVD) or by sputtering.

The front side of the Ge substrate is polished in a well-known chemo-mechanical way. Thereupon, immediately prior to epitaxy, this surface was subjected to a weak chemical etching, for example, with a 10% NaCN solution, by which approximately 150 A, i.e., about 100 atomic layers, are removed within 2 minutes in a manner free of residues, without loss of the polish.

The epitaxial deposition is effected in a furnace having at least three independent zones in a hermetically sealed quartz system, while using high-purity hydrogen which has been purified in a Pd-Ag filter. The method of operation, in principle, is similar to that described by "Tietjen et al" (J. Electrochem. Soc. 113, 724 (1966)).

In the present examples, GaAsP was deposited on the Ge substrate while using several different methods, in a 4-or multiphase process and in the following manner:

In the first phase, GaAs was deposited on the Ge substrate under the following conditions:

the deposition temperature was at 714° C ± 5° C, the reactive gas rates were very low. With a cross-section of about 7 cm$^2$, the GaAs was deposited from the following gas mixture:

$H_2$ + 10% $AsH_3$ : 1 l/h, mixed with $H_2$ + 10% HCl : 1 l/h (a 5% mixture of $AsH_3$ proved to be more advantageous), and $H_2Se$ diluted in $H_2$ was supplied into the reaction chamber, in addition, in a quantity of 4 · 10$^{-5}$ l/h relative to the $H_2Se$ ($H_2S$ or $(CH_3)_2Te$ may also be used instead). The added hydrogen should not exceed an amount of about 8 l/h.

The carrier gas rate in this first phase was about 8 l/h. A thermal etching prior to deposition of the GaAs, for example, with HCl, proved to be disadvantageous and hence is to be avoided during the deposition. A heat-up of the Ge substrate in high-purity hydrogen prior to deposition proved advantageous. For half an hour prior to deposition, the substrate zone was heated to prevent contamination of the substrate at its surface during heat-up of the other parts of the furnace (zone 1 and 2). The maximum temperature amounted to 750° C, and it was lowered again to about 714° C.

The deposition of GaAs under the above conditions was kept constant for about 10 minutes, until all uncovered Ge was sealed with GaAs. The growth rate was about 7 microns in 10 minutes for a (100) oriented Ge.

In a second phase, GaAs was deposited in addition, at increased, in the present example doubled, reactive gas rates. To this end, 10% $AsH_3$ diluted in $H_2$ was fed into the furnace at a flow rate of 2 l/h, and 10% HCl diluted in $H_2$ at a rate of 2 l/h. The additive hydrogen and the $H_2Se$ rate were the same as in the first phase. The duration of this second phase was 10 to 20 minutes.

The just-described second phase may be omitted in cases where the required total thickness of the GaAs layer of about 10 microns is already obtained in the first phase. The second phase has only to ensure a sufficient thickness of the GaAs layer.

With the two initial phases terminated, the temperature in the furnace was raised to a controlled level of about 790° C necessary for the deposition of GaAsP. The reaction was interrupted by switching off the HCl gas and the doping gas (i.e., $SeH_2$ or $Te(CH_3)_2$) until the elevated temperature was reached. For the same period of time, the supply of $AsH_3$ was reduced to about 0.5 l/h. This reduced amount was to prevent a superficial decomposition of GaAs at the high temperatures.

The following third phase is the transition phase in which the phosphine flow rate is increased from 0 to a final rate corresponding to the present, i.e., desired, composition of the $GaAs_{1-x}P_x$ where $0.36 < x < 0.40$. The increase of the flow rate was adjusted in a plurality of steps (about 8 to 12) or continuously by means of a gear.

The following conditions substantially had to be observed:

In this third phase at the latest, if not already in the second phase or in the above-mentioned deposition phase, the temperature had to be increased from about 710° C to about 790° C, and this increased temperature had to be reached prior to reaching the maximum $PH_3$ rate.

The $PH_3$ rate had to be increased from 0 to the maximum rate sufficiently slowly. The respective period of time was between 40 and 120 minutes, depending on the growth rate. The increase had to follow as close as possible a straight line of the phosphine rate $r_{PH_3}$ with respect to time $t$. Thus, the requirement was $r_{PH_3}$ = const. $t$, and the maximum deviation from this relation was less than 20%.

At the start of phase 3, the HCl gas rate was adjusted either to the level corresponding to the sum of the gas rates of $AsH_3$ and $PH_3$ at the end, thus on arrival at the maximum $PH_3$ gas rate, or it was adjusted to the higher level in several steps during the run of phase 3.

At the end of phase 3, the rate of the additional hydrogen was increased to an extent such that the ratio of the sum of the rates of the primary reactive gases (i.e., of $AsH_3$, $PH_3$, and HCl) to the sum of all hydrogen flows and reactive-gases flows was approximately 0.03. This then resulted in the optimum photoluminescence.

The finished epitaxial layers produced in the described manner have been used for manufacturing red light-emitting diodes. In this connection, the already explained advantages of the inventive method came to the fore in a convincing manner.

While specific embodiments of the invention have been described in detail to illustrate the application of the principles of the invention, it will be understood that the invention may be embodied otherwise without departing from such principles.

What is claimed is:

1. A method of epitaxial deposition of an $A_{III}B_V$-semiconductor layer on a germanium substrate having a (100) orientation, said method comprising the steps of: depositing a resist layer, selected from the group consisting of phosphosilica glass (PSG) and $Si_3N_4$, on the backside of the Ge substrate to passivate the backside to an extent such that it becomes thermally and chemically stable and does not release any Ge to the ambient atmosphere; chemo-mechanically polishing the front side of the Ge substrate to microsmoothness; immediately before the epitaxial deposition, subjecting the polished front side to very weak chemical etching to a removal depth of 500 A without eliminating the polish or microsmoothness of the front side; thereupon heating the substrate, in a high-purity hydrogen atmosphere, to a temperature between about 680° C and 720° C, and depositing a GaAs layer on said front side; thereafter increasing the temperature and depositing, on the GaAs layer, a ternary $A_{III}B_V$ compound including a third, additive component whose proportion increases in the direction away from the GaAs layer and which is selected from the group consisting of $A_{III}$ elements and $B_V$ elements; continuing the increase in concentration of said third, additive component to a predetermined final value determined by one of the band gap and corresponding wavelength of the emitted light; and, as a final step, depositing a relatively thick layer of said ternary $A_{III}B_V$ compound whose composition is maintained constant at said predetermined final value of the second layer.

2. A method as claimed in claim 1, including depositing, as the resist layer on the backside of the Ge substrate, a phosphosilicate glass (PSG) layer having an expansion coefficient corresponding to the Ge, in a thickness of 0.15 to 0.3 microns.

3. A method as claimed in claim 1, including depositing, as the resist layer on the backside of the Ge substrate, a $Si_3N_4$ layer, in a pyrolytic procedure, in a thickness of 0.15 to 0.3 microns.

4. A method as claimed in claim 3, in which said $Si_3N_4$ layer is deposited by chemical vapor deposition.

5. A method as claimed in claim 3, in which said $Si_3N_4$ layer is deposited by sputtering.

6. A method as claimed in claim 1, in which the chemical etching of the polished front side of the Ge substrate is effected with a 10% solution of NaCN for a period of time of approximately two minutes.

7. A method as claimed in claim 1, in which the step of depositing the GaAs layer on the polished front side of the substrate, as the first layer, is effected by gaseous arsine ($AsH_3$) diluted in high-purity hydrogen and HCl gas diluted in $H_2$, with the HCl gas being directed so that it flows over gallium which is heated up to 700°–900° C to form volatile Ga chlorides; maintaining the flow density of the carrier hydrogen gas at a value lower than approximately 1 $l/h.cm^2$; and maintaining the flow density of the reactive gases altogether at a value lower than approximately 0.03 $l/h.cm^2$.

8. A method as claimed in claim 7, including the step of, after depositing a first GaAs layer to a thickness of several microns, increasing the rates of the reactive gases.

9. A method as claimed in claim 8, in which the rates of the reactive gases are doubled.

10. A method as claimed in claim 8, in which the rates of the reactive gases are tripled.

11. A method as claimed in claim 1, in which the second layer, deposited on the GaAs first layer, as a ternary $A_{III}B_V$ compound, is GaAsP deposited on the GaAs layer at a temperature of the order of 790° C; the deposition of said second layer of GaAsP being effected by first depositing a transition layer, with a GaP content increasing from zero to 38 mole% up to a thickness of approximately 20 to 30 microns and then depositing the GaAsP layer, of constant composition, containing 38±2 mole% GaP, to approximately the same thickness.

12. A method as claimed in claim 11, in which, to form a p-n-junction, zinc is diffused into the GaAsP layer of constant composition.

13. A method as claimed in claim 12, in which, for diffusing zinc into the GaAsP layer, the surface of the last-deposited layer is coated with a layer containing zinc.

14. A method as claimed in claim 13, in which said last-mentioned layer comprises zinc consisting of zinc silicate.

15. A method as claimed in claim 12, in which zinc is diffused into GaAsP from gaseous zinc phosphide.

16. A method as claimed in claim 13, in which said last-mentioned layer comprises zinc consisting of zinc oxide.

17. A method as claimed in claim 13, including the step of depositing a diffusion barrier layer of $SiO_2$ beneath the layer containing zinc; and covering the diffusion source layer by depositing thereon a phosphorsilica glass (PSG) layer.

18. A method as claimed in claim 17, in which the diffusion barrier layer, the diffusion source layer containing zinc, and the PSG layer are constituted of correspondingly doped silica emulsions, which are consecutively deposited on the coated Ge substrate by being deposited on the epitaxial layer, by spinning.

* * * * *